United States Patent
Avramescu et al.

(10) Patent No.: US 9,634,184 B2
(45) Date of Patent: Apr. 25, 2017

(54) OPTOELECTRONIC SEMICONDUCTOR DEVICE

(71) Applicant: OSRAM Opto Semiconductors GmbH, Regensburg (DE)

(72) Inventors: Adrian Stefan Avramescu, Regensburg (DE); Teresa Wurm, Mintraching (DE); Jelena Ristic, Regensburg (DE); Alvaro Gomez-Iglesias, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/024,825

(22) PCT Filed: Oct. 9, 2014

(86) PCT No.: PCT/EP2014/071651
§ 371 (c)(1),
(2) Date: Mar. 24, 2016

(87) PCT Pub. No.: WO2015/055500
PCT Pub. Date: Apr. 23, 2015

(65) Prior Publication Data
US 2016/0240734 A1    Aug. 18, 2016

(30) Foreign Application Priority Data
Oct. 17, 2013   (DE) .................. 10 2013 017 275

(51) Int. Cl.
*H01L 33/14*    (2010.01)
*H01L 33/04*    (2010.01)
(Continued)

(52) U.S. Cl.
CPC ............ *H01L 33/145* (2013.01); *H01L 33/04* (2013.01); *H01L 33/12* (2013.01); *H01L 33/32* (2013.01);
(Continued)

(58) Field of Classification Search
CPC ..... H01L 33/145; H01L 33/325; H01L 33/12; H01L 33/04; H01L 33/06; H01L 33/44;
(Continued)

(56) References Cited

U.S. PATENT DOCUMENTS 6,590,234 B2    7/2003   Kim et al.
7,732,301 B1 *  6/2010   Pinnington ......... H01L 21/2654
                                                     257/E21.097
(Continued)

FOREIGN PATENT DOCUMENTS

EP    2408028 A2    1/2012
KR    100924454 B1  11/2009
WO    2007005984 A1  1/2007

*Primary Examiner* — Roy Potter
(74) *Attorney, Agent, or Firm* — Slater Matsil, LLP

(57) ABSTRACT

An optoelectronic semiconductor component includes a layer stack based on a nitride compound semiconductor and has an n-type semiconductor region, a p-type semiconductor region and an active layer arranged between the n-type semiconductor region and the p-type semiconductor region. In order to form an electron barrier, the p-type semiconductor region includes a layer sequence having a plurality of p-doped layers composed of $Al_xIn_yGa_{1-x-y}N$ where $0<=x<=1$, $0<=y<=1$ and $x+y<=1$. The layer sequence includes a first p-doped layer having an aluminum proportion $x1>=0.5$ and a thickness of not more than 3 nm, and the first p-doped layer, at a side facing away from the active layer, is succeeded by at least a second p-doped layer having an aluminum proportion $x2<x1$ and a third p-doped layer having an aluminum proportion $x3<x2$.

18 Claims, 4 Drawing Sheets

(51) Int. Cl.
*H01L 33/32* (2010.01)
*H01S 5/20* (2006.01)
*H01S 5/343* (2006.01)
*H01S 5/30* (2006.01)
*H01L 33/12* (2010.01)

(52) U.S. Cl.
CPC .......... *H01L 33/325* (2013.01); *H01S 5/2009* (2013.01); *H01S 5/3054* (2013.01); *H01S 5/3063* (2013.01); *H01S 5/34333* (2013.01)

(58) Field of Classification Search
CPC ........... H01L 21/0254; H01L 21/02458; H01L 33/0075; H01S 5/2009; H01S 5/3054; H01S 5/3063; H01S 5/34333
See application file for complete search history.

(56) References Cited

U.S. PATENT DOCUMENTS

| | | |
|---|---|---|
| 7,893,443 B2 | 2/2011 | Kim et al. |
| 2012/0033444 A1 | 2/2012 | Moon et al. |
| 2013/0016751 A1 | 1/2013 | Takado et al. |
| 2013/0069034 A1 | 3/2013 | Hirayama |

* cited by examiner

OPTOELECTRONIC SEMICONDUCTOR DEVICE

This patent application is a national phase filing under section 371 of PCT/EP2014/071651, filed Oct. 9, 2014, which claims the priority of German patent application 10 2013 017 275.6, filed Oct. 17, 2013, each of which is incorporated herein by reference in its entirety.

TECHNICAL FIELD

The invention relates to an optoelectronic semiconductor device, which is based on a nitride compound semiconductor.

BACKGROUND

The efficiency of light-emitting devices based on nitride compound semiconductors is dependent on how effectively charge carriers can be injected into the active layer and confined therein. If not all the charge carriers recombine in the active layer, but rather are lost in other regions of the semiconductor device, efficiency decreases. In particular the lasing threshold and the steepness of the characteristic curve of semiconductor lasers based on nitride compound semiconductors are dependent on charge carrier injection efficiency.

In order effectively to capture electrons in the active layer of a light-emitting device based on a nitride compound semiconductor, a p-doped electron barrier layer adjoining the active layer may be used, which generally has a comparatively high aluminum content of up to thirty per cent. It has however been demonstrated that a conventional electron barrier layer generates strong piezoelectric fields due to the great lattice mismatch between the electron barrier layer and the surrounding semiconductor material. The piezoelectric fields bring about local deformation of the band structure, which leads to the formation of band edge minima in the region of the electron barrier layer. For this reason, high electron and hole densities may arise there, which may lead to optical losses.

SUMMARY OF THE INVENTION

Embodiments of the present invention provide an optoelectronic semiconductor device based on a nitride compound semiconductor, in which charge carriers are effectively confined in the active zone, wherein piezoelectric fields and resultant optical losses are reduced.

According to at least one configuration, the optoelectronic semiconductor device comprises a layer stack based on a nitride compound semiconductor. "Based on a nitride compound semiconductor" means in the present context that the layer stack or at least one layer thereof comprises a III-nitride compound semiconductor material, preferably $Al_xIn_yGa_{1-x-y}N$, wherein $0 \leq x \leq 1$, $0 \leq y \leq 1$ and $x+y \leq 1$ This material does not absolutely have to exhibit a mathematically exact composition according to the above formula. Instead, it may comprise one or more dopants and additional constituents which do not substantially modify the characteristic physical properties of the $Al_xIn_yGa_{1-x-y}N$ material. For simplicity's sake, however, the above formula includes only the fundamental constituents of the crystal lattice (Al, In, Ga, N), even if these may in part be replaced by small quantities of further substances. The optoelectronic semiconductor device is preferably a light-emitting semiconductor device, for example, an LED or a laser diode.

The layer stack comprises an n-type semiconductor region, a p-type semiconductor region and an active layer arranged between the n-type semiconductor region and the p-type semiconductor region. The active layer may in particular be a radiation-emitting active layer. The active layer may, for example, take the form of a pn-junction, of a double heterostructure, of a single quantum well structure or of a multiple quantum well structure. The term "quantum well structure" here includes any structure in which charge carriers undergo quantization of their energy states by confinement. In particular, the term quantum well structure does not provide any indication of the dimensionality of the quantization. It thus encompasses inter alia quantum wells, quantum wires and quantum dots and any combination of these structures.

To form an electron barrier, the p-type semiconductor region comprises a layer sequence with a plurality of p-doped layers, wherein the layer sequence has a first p-doped layer with an aluminum content of $x1 > 0.5$ and a thickness of no more than 3 nm. The first p-doped layer is preferably the layer of the layer sequence closest to the active layer.

According to one configuration, the first p-doped layer is followed on a side remote from the active layer by at least one second p-doped layer with an aluminum content of $x2 < x1$ and one third p-doped layer with an aluminum content of $x3 < x2$.

In the optoelectronic semiconductor device, to confine electrons in the active layer and to improve injection efficiency an electron barrier is advantageously formed from the layer sequence of at least three p-doped layers, of which the first p-doped layer closest to the active layer has the highest aluminum content $x1$.

In nitride compound semiconductor materials, the electronic band gap increases with an increasing aluminum content in the semiconductor material. Since the first p-doped layer has an aluminum content $x1 > 0.5$, the first p-doped layer has a large electronic band gap, which forms an advantageously high barrier for electrons which are moving from the direction of the active layer towards the p-doped semiconductor region. Because, with a thickness of no more than 3 nm, the first p-doped layer is very thin and p-doped, good injection of holes into the active layer is nonetheless achieved. In this way, good injection efficiency of charge carriers into the active layer is achieved.

The second p-doped layer following the first p-doped layer has a lower aluminum content $x2$ and thus a smaller electronic band gap than the first p-doped layer. The third p-doped layer following the second p-doped layer in turn has a lower aluminum content than the second p-doped layer and thus a smaller electronic band gap than the second p-doped layer. In other words the first p-doped layer is followed by at least two layers, wherein the aluminum content reduces from layer to layer. In this way, strains resulting from lattice mismatch between the semiconductor layers and piezoelectric fields arising from tensions may advantageously be reduced.

In one preferred configuration, the first p-doped layer has an aluminum content $x1 > 0.8$. In this way, a particularly good barrier action for electrons is achieved.

The second p-doped layer advantageously has an aluminum content $x2$ which is lower than the aluminum content $x1$ of the first p-doped layer. The aluminum content of the second p-doped layer is preferably $x2 \leq 0.4$, particularly preferably $x2 \leq 0.3$.

The aluminum content $x2$ in the second p-doped layer does not necessarily have to be constant. Rather, it is also possible for the second p-doped layer to have an aluminum content x2 gradient at least in one sub-region. In this case, it is in particular possible for the aluminum content x2 in the second p-doped layer to reduce in the direction of the third p-doped layer. The aluminum content x2 in the second p-doped layer may in particular reduce continuously, for example, in a linear manner.

The second p-doped layer preferably has a thickness of less than 20 nm. The second p-doped layer may be thicker than the particularly thin first p-doped layer, wherein the second p-doped layer, with a thickness of no more than 20 nm, is however advantageously only a very thin layer compared with conventional electron barrier layers. As a result of the thin second p-doped layer, whose aluminum content lies between the aluminum content x1 of the first p-doped layer and the aluminum content x3 of the third p-doped layer, mechanical tensions which would occur in the case of an abrupt change in the aluminum content due to the resultant abrupt change in the lattice constant are advantageously reduced.

In a preferred configuration, the third p-doped layer has an aluminum content x3≤0.1.

In a further advantageous configuration, a fourth p-doped layer is arranged between the first p-doped layer and the second p-doped layer, which fourth p-doped layer has a thickness of less than 4 nm. This very thin fourth p-doped layer offers a further possibility of adjusting the profile of the electronic band gap to achieve particularly good injection efficiency, and further to reduce mechanical tensions. In particular, improved hole injection may be achieved by means of the thin fourth p-doped layer by reducing the effective potential barrier.

In one preferred configuration, the fourth p-doped layer has an aluminum content x4, wherein x4<x1 and x4<x2. In other words, the aluminum content in the fourth p-doped layer is less both than the aluminum content x1 in the first p-doped layer and the aluminum content in the second p-doped layer. In this configuration, the rise in aluminum content taking place step-wise in a direction towards the active layer is interrupted between the second p-doped layer and the first p-doped layer.

In one configuration, the fourth p-doped layer has an aluminum content x4 gradient, wherein the aluminum content x4 in the fourth p-doped layer has a minimum, at which x4<x1 and x4<x2. For example, the aluminum content x4 in the fourth p-doped layer may drop, starting from the first p-doped layer, initially continuously down to a minimum, at which the aluminum content x4 is less than the aluminum content x1 and the aluminum content x2 of the second p-doped layer, and after the minimum may rise continuously up to the aluminum content x2 of the second p-doped layer.

The p-doped layers of the layer sequence functioning as an electron barrier preferably have a low indium content y≤0.1. Particularly preferably, y≤0.05 applies to the indium content in the p-doped layers.

According to one advantageous configuration, a dopant concentration in the p-doped layers has a value of at least $1\times10^{18}$ cm$^{-3}$, preferably between $1\times10^{18}$ cm$^{-3}$ and $1\times10^{20}$ cm$^{-3}$. As a result of the comparatively high p-doping, good hole injection into the active layer is advantageously achieved. The p-doped layers preferably comprise magnesium as dopant. Alternatively, however, other p-dopants or combinations of a plurality of dopants may also be used.

In one further advantageous configuration, an interlayer is arranged between the active layer and the layer sequence, which interlayer is undoped or has a dopant concentration of no more than $5\times10^{17}$ cm$^{-3}$. The interlayer thus has only very slight doping or even no doping at all, wherein in the case of slight doping the interlayer is, for example, p-doped with magnesium as dopant.

In the case of p-doping, the interlayer preferably comprises a dopant concentration gradient, wherein the dopant concentration reduces towards the active layer. The interlayer may, for example, function as a waveguide layer, in particular if the optoelectronic semiconductor device is an edge emitter semiconductor laser. The interlayer advantageously increases the distance between a maximum of an optical mode carried in the waveguide and the region of the p-doped layer sequence.

The interlayer preferably comprises $Al_xIn_yGa_{1-x-y}N$ with 0≤x≤0.02 and 0≤y≤0.1. The interlayer thus has only a very low aluminum and indium content, such that the interlayer comprises only a very small electronic band gap compared with the following first p-doped layer of the layer sequence. A particularly big jump in aluminum content therefore takes place at the boundary between the interlayer and the first p-doped layer, whereby a particularly efficient barrier for electrons is achieved.

BRIEF DESCRIPTION OF THE DRAWINGS

The invention is explained in greater detail below with reference to exemplary embodiments in conjunction with FIGS. 1 to 8, in which.

In the figures identical or identically acting components are in each case provided with the same reference numerals. The components illustrated and the size ratios of the components to one another should not be regarded as to scale.

DETAILED DESCRIPTION OF ILLUSTRATIVE EMBODIMENTS

Figure 1:
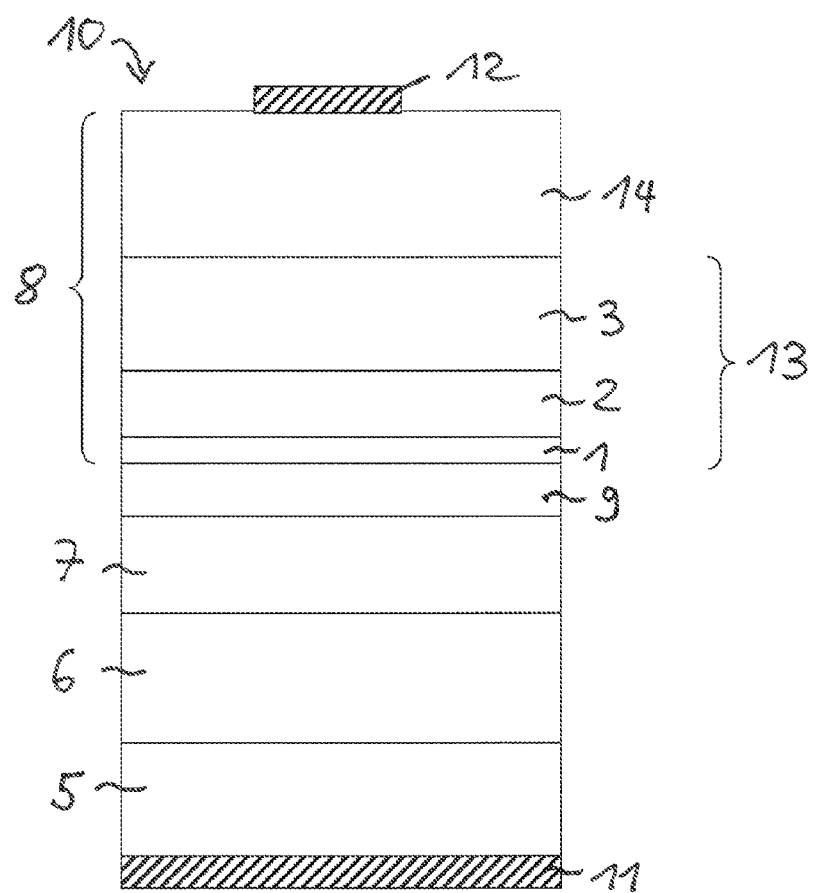
FIG. 1 is a schematic representation of a cross-section through an optoelectronic semiconductor device according to a first exemplary embodiment.

The optoelectronic device 10 according to a first exemplary embodiment and illustrated in FIG. 1 comprises a light-emitting semiconductor device, which may, for example, be an LED or a laser diode. The optoelectronic semiconductor device 10 comprises a layer stack applied to a substrate 5, with an n-type semiconductor region 6, a p-type semiconductor region 8 and an active layer 7 arranged between the n-type semiconductor region 6 and the p-type semiconductor region 8. The layer stack is in particular an epitaxial layer sequence, which was grown epitaxially onto the substrate 5. The optoelectronic semiconductor device 10 does not necessarily have to have a substrate 5, rather the latter may be detached after production of the epitaxial layer sequence.

For electrical contacting, the optoelectronic semiconductor device 10, for example, comprises a first electrode layer 11 and a second electrode layer 12, wherein the first electrode layer 11 may, for example, be arranged on a back, remote from the layer stack, of the substrate 5 and the second electrode layer 12 may be arranged on an opposite surface of the layer stack from the substrate 5. Alternatively, there are also other possible ways of contacting the optoelectronic semiconductor device 10. For example, both electrode layers 11, 12 may be arranged on the same main face of the optoelectronic semiconductor device 10.

The layer stack of the optoelectronic semiconductor device 10 is based on a nitride compound semiconductor, i.e., the semiconductor layers contained therein comprise III-nitride compound semiconductor materials, preferably $Al_xIn_yGa_{1-x-y}N$, wherein $0 \leq x \leq 1$, $0 \leq y \leq 1$ and $x+y \leq 1$.

The active layer 7 may, for example, have a quantum well structure or a multiple quantum well structure. The n-type semiconductor region 6 and the active layer 7 may in each case be formed from a plurality of sublayers, which are not illustrated individually to simplify the representation.

The p-type semiconductor region 8 comprises a p-doped layer sequence 13, which serves as an electron barrier for electrons injected into the active layer 7. The p-type semiconductor region 8 may contain one or more further layers in addition to the layer sequence 13, for example, a p-type contact layer 14.

The p-doped layers 1, 2, 3 of the layer sequence 13 each comprise a nitride compound semiconductor material with the composition $Al_xIn_yGa_{1-x-y}N$ with $0 \leq x \leq 1$, $0 \leq y \leq 1$ and $x+y \leq 1$. A first p-doped layer 1 closest to the active layer 7 has an aluminum content $x1 \leq 0.5$ and a thickness of no more than 3 nm. The first p-doped layer 1 is followed on a side remote from the active layer 7 by at least one second p-doped layer 2 with an aluminum content $x2 < x1$ and one third p-doped layer 3 with an aluminum content $x3 < x2$.

Because the first p-doped layer 1 of the layer sequence 13 closest to the active layer 7 has a comparatively high aluminum content $x1 \geq 0.5$, the layer 1 has a comparatively large electronic band gap. The first p-doped layer 1 preferably has the largest electronic band gap within the layer stack of the optoelectronic semiconductor device 10. Due to the comparatively large electronic band gap, the first p-doped layer 1 forms an effective barrier for electrons propagating from the active layer 7 towards the second electrode layer 12, which in particular forms a p-electrode. Electrons are therefore advantageously confined in the active layer 7, whereby the number of radiative recombinations in the active layer 7 is increased, so improving the efficiency of the optoelectronic semiconductor device 10. Because the first p-doped layer 1 has a very large electronic band gap, while on the other hand being very thin, with a thickness of less than 3 nm, the injection of holes into the active layer 7 is not significantly reduced.

The first p-doped layer 1 is followed in the layer sequence 13 by a second p-doped layer 2, which has an aluminum content $x2$ which is lower than the aluminum content $x1$ in the first p-doped layer 1. Furthermore, the second p-doped layer 2 is followed by a third p-doped layer 3, the aluminum content $x3$ of which is lower than the aluminum content $x2$ of the second p-doped layer 2. In other words, the aluminum content x in the layer sequence 13 decreases step-wise in a direction pointing from the active layer 7 to the p-electrode layer 12.

Particularly preferably, the first p-doped layer 1 has an aluminum content $x1 \geq 0.8$. The second p-doped layer 2 preferably has an aluminum content $x2 \leq 0.4$, particularly preferably $x2 \leq 0.3$. The thickness of the second p-doped layer amounts preferably to less than 20 nm.

The third p-doped layer 3 advantageously comprises an aluminum content $x3 \leq 0.1$. Through the step-wise decrease in aluminum content in the layer sequence 13, mechanical tensions caused by lattice mismatch and resultant piezoelectric fields, which could bring about recombinations of charge carriers outside the active zone and thus optical losses, are advantageously reduced.

In the optoelectronic semiconductor device 10 the first p-doped layer 1 of the p-doped layer sequence 13 does not have to directly adjoin the active layer 7. Rather, an interlayer 9 may be arranged between the active layer 7 and the first p-doped layer 1, which interlayer is preferably undoped or has only a very low dopant concentration of less than $5 \times 10^{17}$ cm$^{-3}$. The interlayer 9 may, for example, comprise p-doping with an above-mentioned low dopant concentration.

In contrast, the p-doped layers 1, 2, 3 of the layer sequence 13 preferably comprise a dopant concentration of at least $1 \times 10^{18}$ cm$^{-3}$, preferably between $1 \times 10^{18}$ cm$^{-3}$ and $1 \times 10^{20}$ cm$^{-3}$. The p-doped layers 1, 2, 3 may in particular have magnesium as p-dopant.

Figure 2:
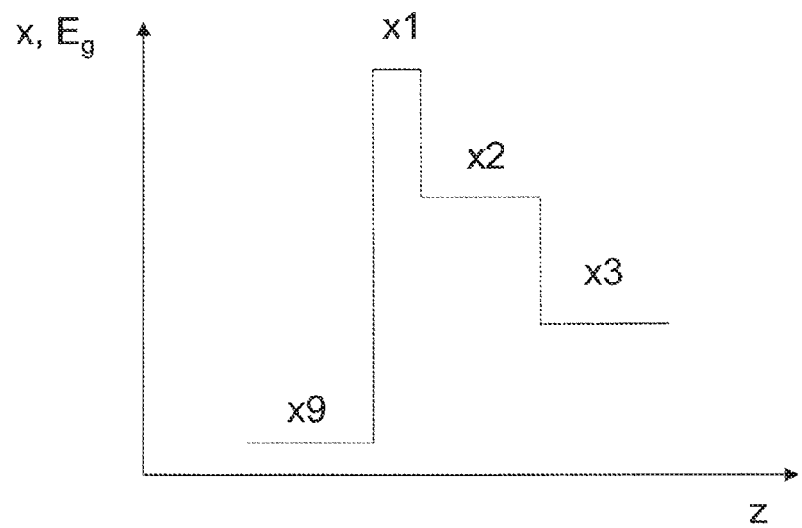
FIGS. 2 and 3 each show graphical representations of the profile of the aluminum content x and of the electronic band gap $E_g$ in one region of an optoelectronic semiconductor device according to the first exemplary embodiment.
Figure 3:
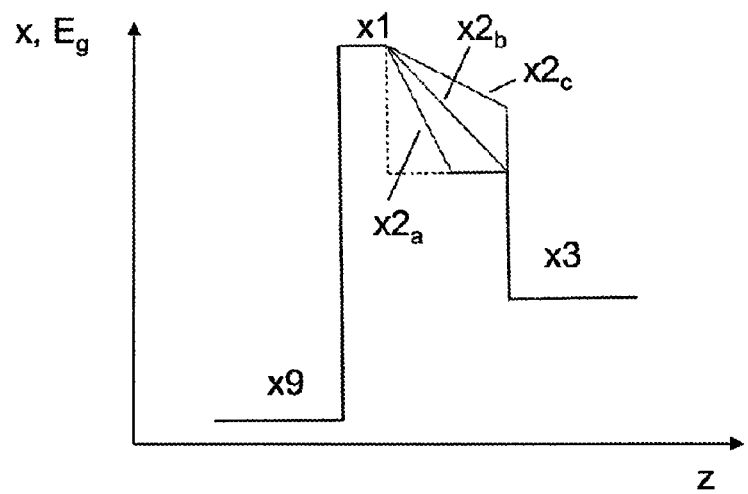

FIGS. 2 and 3 are schematic representations along a spatial coordinate z extending in the growth direction of the layer stack of the profile of the aluminum content x, which corresponds qualitatively to the profile of the electronic band gap $E_g$, in the interlayer 9 and the layers 1, 2, 3 of the p-doped layer sequence 13. The interlayer 9 has a very low aluminum content x9, for which $x9 \leq 0.02$ preferably applies. In the exemplary embodiment of FIG. 2, this is followed by the first p-doped layer 1 with an aluminum content $x1 \geq 0.5$, preferably $x1 \geq 0.8$, the second p-doped layer 2 with an aluminum content $x2 \leq 0.4$, preferably $x2 \leq 0.3$, and the third p-doped layer 3 with an aluminum content $x3 \leq 0.1$.

The exemplary embodiment of FIG. 3 differs from the exemplary embodiment in FIG. 2 in that the aluminum content $x2$ in the second p-doped layer 2 is not constant, but rather has a gradient at least in places. Three variants $x2_a$, $x2_b$ and $x2_c$ are shown schematically for the profile of the aluminum content x2 in the second p-doped layer 2. In variant $x2_a$ the aluminum content decreases continuously from the first p-doped layer 1 in a first region and is then constant in a following sub-region. In variant $x2_b$ the aluminum content in the second p-doped layer 2 decreases continuously from the value x1 in the first p-doped layer 1 to a lower value at the interface with the third p-doped layer 3. In variant $x2_c$ the aluminum content in the second p-doped layer 2 likewise decreases continuously from the first p-doped layer 1 towards the third p-doped layer 3, wherein the final value at the interface with the third p-doped layer 3 is however greater than in the variant $x2_b$.

Figure 4:
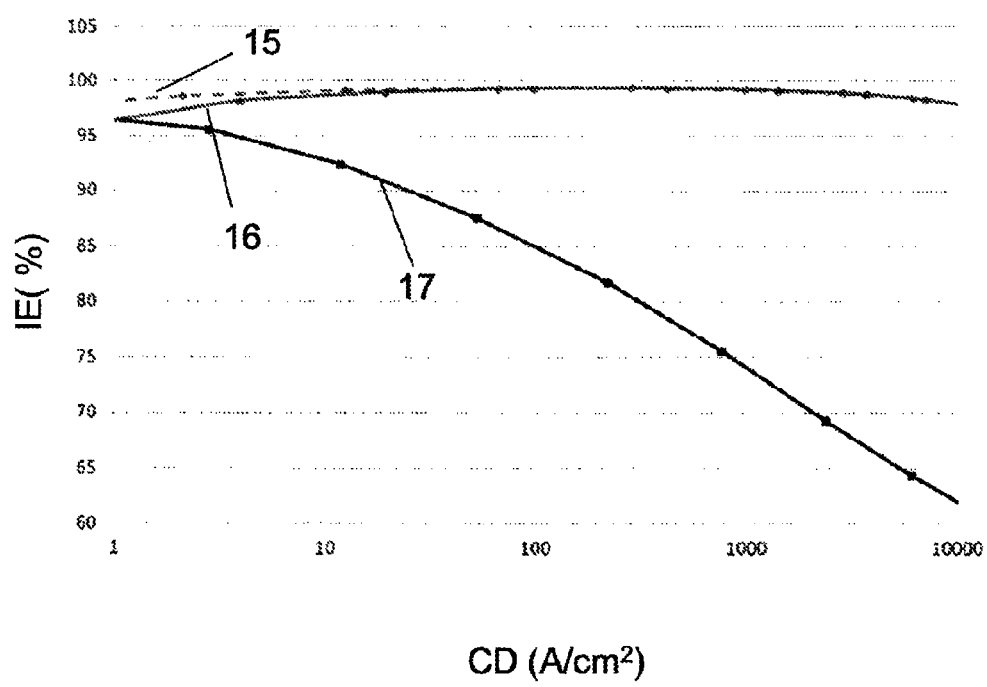
FIG. 4 shows a graphical representation of injection efficiency as a function of the current density at two optoelectronic semiconductor devices according to the first exemplary embodiment compared with a conventional optoelectronic semiconductor device.

FIG. 4 shows the injection efficiency IE as a function of the current density CD for an optoelectronic device according to the first exemplary embodiment with a first p-doped layer 1 of $Al_{0.80}In_{0.20}N$ and a second p-doped layer 2 of $Al_{0.30}Ga_{0.70}N$ (curve 15), for a further optoelectronic semiconductor device according to the first exemplary embodiment with a first p-doped layer 1 of $Al_{0.99}In_{0.01}N$ and a second p-doped layer 2 of $Al_{0.30}Ga_{0.70}N$ (curve 16) and for a conventional optoelectronic device with a simple electron barrier layer of $Al_{0.30}Ga_{0.70}N$ (curve 17). It is clear that the injection efficiency in the case of the optoelectronic semiconductor devices according to the exemplary embodiment is improved over the conventional optoelectronic semiconductor device, especially for large current densities.

Figure 5:
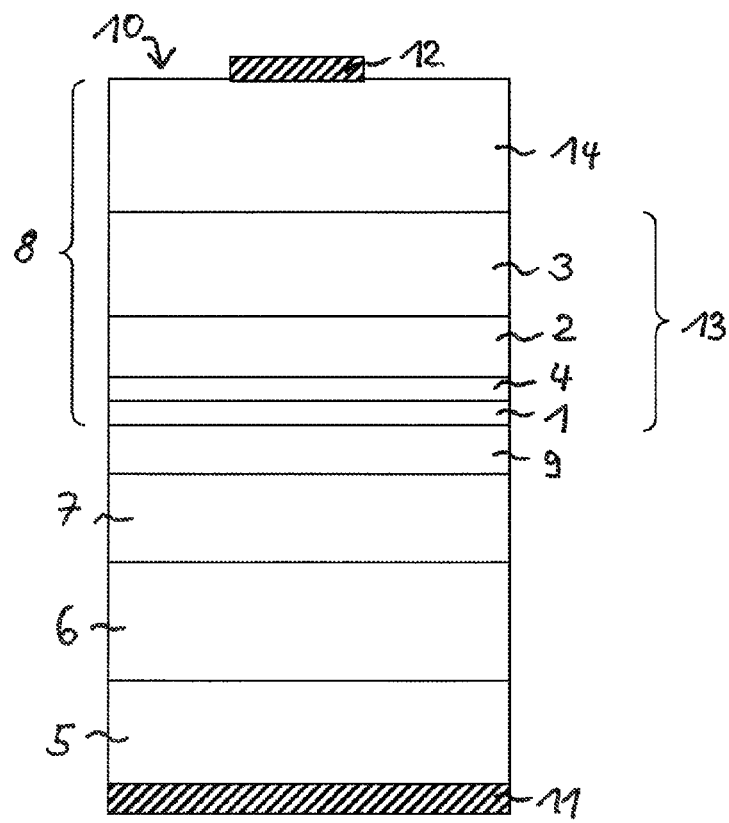
FIG. 5 shows a schematic representation of a cross-section through an optoelectronic semiconductor component according to a second exemplary embodiment.

FIG. 5 shows a second exemplary embodiment of the optoelectronic semiconductor device schematically in cross-section. The second exemplary embodiment differs from the first exemplary embodiment in that a fourth p-doped layer 4 is arranged between the first p-doped layer 1 and the second p-doped layer 2 of the layer sequence 13. The fourth p-doped layer 4 is preferably a very thin layer, like the first p-doped layer 1, and preferably has a thickness of no more than 4 nm. By means of the additional layer 4, the profile of the electronic band structure in the layer sequence 13 may be optimized still further to improve injection efficiency and to reduce piezoelectric fields.

The second exemplary embodiment illustrated shown in FIG. 5 otherwise corresponds to the first exemplary embodiment shown in FIG. 1.

Figure 6:
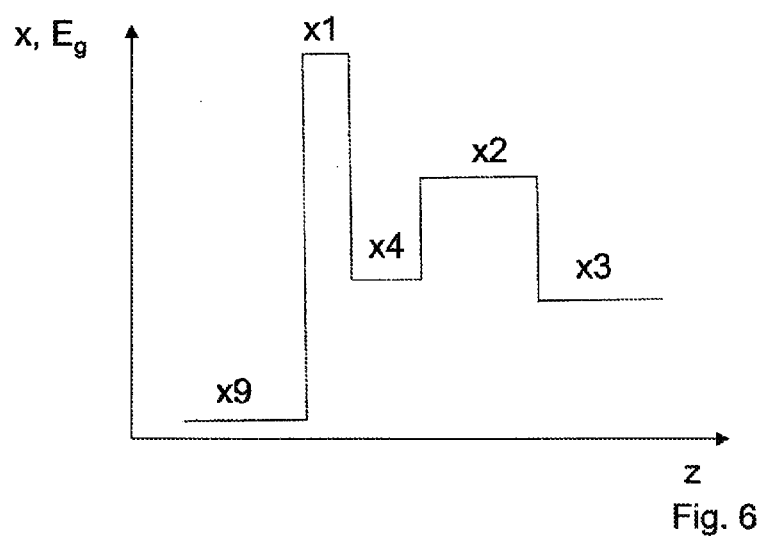
FIGS. 6 to 8 each show graphical representations of the profile of the aluminum content x and of the electronic band gap $E_g$ in one region of an optoelectronic semiconductor device according to the second exemplary embodiment.
Figure 7:
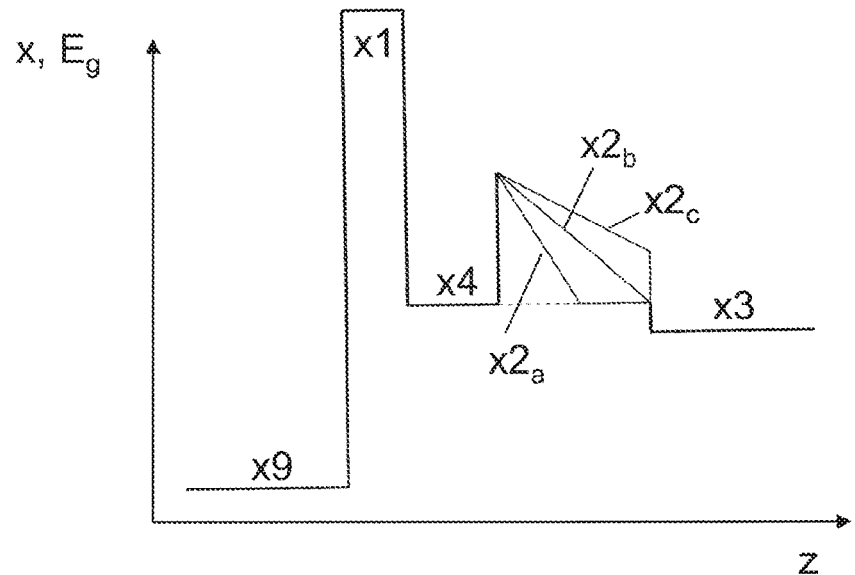
Figure 8:
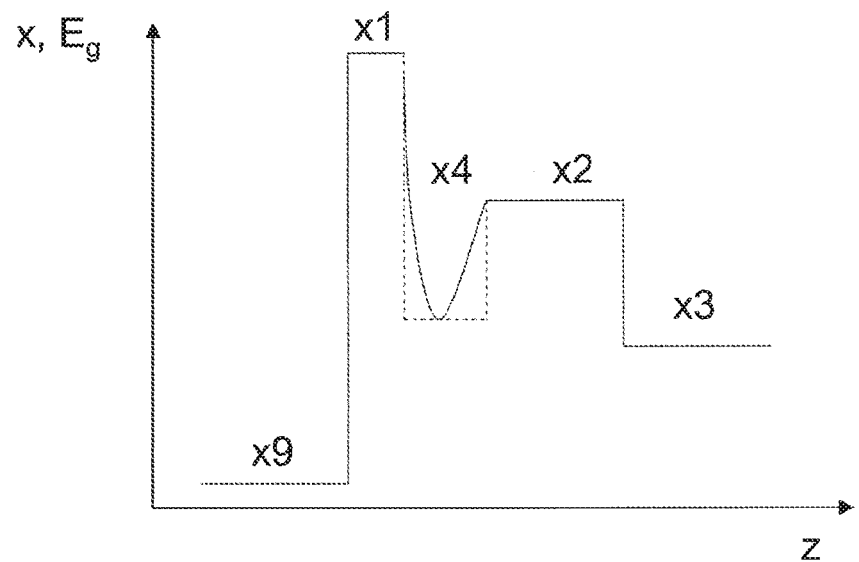

Examples of profiles for the aluminum content x and the corresponding electronic band gap $E_g$ in the second exemplary embodiment are shown in FIGS. 6 to 8.

In the exemplary embodiment of FIG. 6, the fourth p-doped layer 4 has an aluminum content x4 which is lower than the aluminum content x1 of the first p-doped layer and the aluminum content x2 of the second p-doped layer. It would alternatively however also be feasible for the fourth p-doped layer 4 to have an aluminum content x4 which is even greater than the aluminum content x1 in the first p-doped layer 1.

In the exemplary embodiment of FIG. 6, the profile of the aluminum content x2 and of the electronic band gap in the second p-doped layer 2 and the third p-doped layer 3 corresponds to the example shown in FIG. 2.

As in the exemplary embodiment of FIG. 3, the second p-doped layer 2 may also comprise an aluminum content x2 gradient in the embodiment with the additional fourth p-doped layer 4. Such an example is shown in FIG. 7. In this exemplary embodiment, as in the exemplary embodiment of FIG. 6, a fourth p-doped layer 4 with an aluminum content x4 is arranged between the first p-doped layer 1 and the second p-doped layer 2, wherein the profile of the aluminum content x2 in the second p-doped layer 2 and of the aluminum content x3 in the third p-doped layer 3 corresponds to the variants shown in FIG. 3.

The exemplary embodiment of FIG. 8 differs from the exemplary embodiment shown in FIG. 6 in that the fourth p-doped layer 4 has an aluminum content x4 gradient. In particular, the aluminum content x4 within the fourth p-doped layer 4 falls, starting from the first p-doped layer 1, initially continuously down to a minimum, at which the aluminum content x4 is less than the aluminum content x2 in the second p-doped layer 2. After the minimum the aluminum content x4 in the fourth p-doped layer 4 rises continuously again to the value of the aluminum content x2 in the second p-doped layer 2.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor device formed from a layer stack based on a nitride compound semiconductor, the layer stack comprising:
   an n-type semiconductor region;
   an active layer overlying the n-type semiconductor region; and
   a layer sequence comprising a plurality of p-doped layers of $Al_xIn_yGa_{1-x-y}N$ overlying the active layer, where $0 \leq x \leq 1$, $0 \leq y \leq 1$ and $x+y \leq 1$, the layer sequence including a first p-doped layer with an aluminum content $x1 \geq 0.5$ and a thickness of no more than 3 nm overlying the active layer, a second p-doped layer with an aluminum content $x2 < x1$ overlying the first p-doped layer, and a third p-doped layer with an aluminum content $x3 < x2$.

2. The optoelectronic semiconductor device according to claim 1, wherein the plurality of p-doped layers form an electron barrier.

3. The optoelectronic semiconductor device according to claim 1, wherein the first p-doped layer has an aluminum content $x1 \geq 0.8$.

4. The optoelectronic semiconductor device according to claim 1, wherein the second p-doped layer has an aluminum content $x2 \leq 0.4$.

5. The optoelectronic semiconductor device according to claim 4, wherein the second p-doped layer has an aluminum content $x2 \leq 0.3$.

6. The optoelectronic semiconductor device according to claim 1, wherein the second p-doped layer has an aluminum content gradient at least in a sub-region, wherein the aluminum content x2 decreases in a direction of the third p-doped layer.

7. The optoelectronic semiconductor device according to claim 1, wherein the second p-doped layer has a thickness of less than 20 nm.

8. The optoelectronic semiconductor device according to claim 1, wherein the third p-doped layer has an aluminum content $x3 \leq 0.1$.

9. The optoelectronic semiconductor device according to claim 1, further comprising a fourth p-doped layer between the first p-doped layer and the second p-doped layer, the fourth p-doped layer having a thickness of less than 4 nm.

10. The optoelectronic semiconductor device according to claim 9, wherein the fourth p-doped layer has an aluminum content x4, wherein $x4 < x2$.

11. The optoelectronic semiconductor device according to claim 9, wherein the fourth p-doped layer has an aluminum content x4 having a gradient, wherein the aluminum content x4 in the fourth p-doped layer has a minimum, at which $x4 < x2$.

12. The optoelectronic semiconductor device according to claim 1, wherein the first, second and third p-doped layers have an indium content, the indium content of each of the first, second and third p-doped layers being less than or equal to 0.1.

13. The optoelectronic semiconductor device according to claim 1, wherein the first, second and third p-doped layers have a dopant concentration of $1 \times 10^{18}$ cm$^{-3}$ to $1 \times 10^{20}$ cm$^{-3}$.

14. The optoelectronic semiconductor device according to claim 1, further comprising an interlayer arranged between the active layer and the first p-doped layer, wherein the interlayer has a dopant concentration of no more than $5 \times 10^{17}$ cm$^{-3}$.

15. The optoelectronic semiconductor device according to claim 14, wherein the interlayer is undoped.

16. The optoelectronic semiconductor device according to claim 14, wherein the interlayer comprises $Al_xIn_yGa_{1-x-y}N$ with $0 \leq x \leq 0.02$ and $0 \leq y \leq 0.1$.

17. The optoelectronic semiconductor device according to claim 14, wherein the interlayer has an indium-content $y < 0.05$.

18. An optoelectronic semiconductor device, comprising a layer stack based on a nitride compound semiconductor which comprises an n-type semiconductor region, a p-type semiconductor region and an active layer arranged between the n-type semiconductor region and the p-type semiconductor region;
- wherein to form an electron barrier, the p-type semiconductor region comprises a layer sequence with a plurality of p-doped layers of $Al_xIn_yGa_{1-x-y}N$ with $0 \leq x \leq 1$, $0 \leq y \leq 1$ and $x+y \leq 1$;
- wherein the layer sequence has a first p-doped layer with an aluminum content $x1 \geq 0.5$ and a thickness of no more than 3 nm;
- wherein the first p-doped layer is followed on a side remote from the active layer by at least one second p-doped layer with an aluminum content $x2 < x1$ and one third p-doped layer with an aluminum content $x3 < x2$;
- wherein a fourth p-doped layer is arranged between the first p-doped layer and the second p-doped layer, the fourth p-doped layer having a thickness of less than 4 nm; and
- wherein the fourth p-doped layer has an aluminum content $x4$ having a gradient, wherein the aluminum content $x4$ in the fourth p-doped layer has a minimum, at which $x4 < x1$ and $x4 < x2$.

* * * * *